(12) United States Patent
Stagon et al.

(10) Patent No.: US 10,646,964 B2
(45) Date of Patent: May 12, 2020

(54) LOW-TEMPERATURE BONDING WITH SPACED NANORODS AND EUTECTIC ALLOYS

(71) Applicants: Northeastern University, Boston, MA (US); University of North Florida Board of Trustees, Jacksonville, FL (US)

(72) Inventors: Stephen Peter Stagon, Jacksonville, FL (US); Hanchen Huang, Boston, MA (US); Paul Robert Elliott, Boston, MA (US)

(73) Assignees: Northeastern University, Boston, MA (US); University of North Florida Board of Trustees, Jacksonville, FL (US)

( * ) Notice: Subject to any disclaimer, the term of this patent is extended or adjusted under 35 U.S.C. 154(b) by 244 days.

(21) Appl. No.: 15/746,536

(22) PCT Filed: Jul. 19, 2016

(86) PCT No.: PCT/US2016/042966
§ 371 (c)(1),
(2) Date: Jan. 22, 2018

(87) PCT Pub. No.: WO2017/019385
PCT Pub. Date: Feb. 2, 2017

(65) Prior Publication Data
US 2018/0200840 A1    Jul. 19, 2018

Related U.S. Application Data

(60) Provisional application No. 62/196,684, filed on Jul. 24, 2015.

(51) Int. Cl.
*B23K 35/00* (2006.01)
*B23K 35/26* (2006.01)
(Continued)

(52) U.S. Cl.
CPC ........... *B23K 35/264* (2013.01); *B23K 35/02* (2013.01); *B23K 35/0227* (2013.01);
(Continued)

(58) Field of Classification Search
CPC ........... B23K 35/0261; B23K 35/0227; B23K 35/264; B23K 2101/40; B23K 2101/42;
(Continued)

(56) References Cited

U.S. PATENT DOCUMENTS

| | | | |
|---|---|---|---|
| 4,772,935 A * | 9/1988 | Lawler | H01L 23/488 228/121 |
| 2008/0003778 A1 | 1/2008 | Eyck et al. | |
| 2015/0099316 A1 | 4/2015 | Ryu et al. | |

FOREIGN PATENT DOCUMENTS

| | | |
|---|---|---|
| CN | 1792531 A | 6/2006 |
| CN | 1819172 A | 8/2006 |

(Continued)

OTHER PUBLICATIONS

International Search Report and Written Opinion dated Oct. 7, 2016 for International Application No. PCT/US2016/042966, entitled "Low-Temperature Bonding with Spaced Nanorods and Eutectic Alloys".

(Continued)

*Primary Examiner* — Erin B Saad
(74) *Attorney, Agent, or Firm* — Hamilton, Brook, Smith & Reynolds, P.C.

(57) ABSTRACT

Bonded surfaces are formed by adhering first nanorods and second nanorods to respective first and second surfaces. The first shell is formed on the first nanorods and the second shell is formed on the second nanorods, wherein at least one of the first nanorods and second nanorods, and the first shell and the second shell are formed of distinct metals. The surfaces are then exposed to at least one condition that causes the (Continued)

distinct metals to form an alloy, such as eutectic alloy having a melting point below the temperature at which the alloy is formed, thereby bonding the surfaces upon which solidification of the alloy.

39 Claims, 4 Drawing Sheets

(51) Int. Cl.
  *B23K 35/02* (2006.01)
  *H01L 23/00* (2006.01)
  *B23K 101/40* (2006.01)
  *B23K 101/42* (2006.01)
(52) U.S. Cl.
  CPC .......... *B23K 35/0261* (2013.01); *B23K 35/26* (2013.01); *H01L 24/27* (2013.01); *H01L 24/29* (2013.01); *H01L 24/32* (2013.01); *H01L 24/83* (2013.01); *B23K 2101/40* (2018.08); *B23K 2101/42* (2018.08); *H01L 2224/0345* (2013.01); *H01L 2224/03462* (2013.01); *H01L 2224/04026* (2013.01); *H01L 2224/05082* (2013.01); *H01L 2224/05124* (2013.01); *H01L 2224/05144* (2013.01); *H01L 2224/05155* (2013.01); *H01L 2224/05164* (2013.01); *H01L 2224/05166* (2013.01); *H01L 2224/05171* (2013.01); *H01L 2224/05178* (2013.01); *H01L 2224/05181* (2013.01); *H01L 2224/05184* (2013.01); *H01L 2224/05186* (2013.01); *H01L 2224/05583* (2013.01); *H01L 2224/05618* (2013.01); *H01L 2224/05624* (2013.01); *H01L 2224/05639* (2013.01); *H01L 2224/05647* (2013.01); *H01L 2224/05655* (2013.01); *H01L 2224/05664* (2013.01); *H01L 2224/05669* (2013.01); *H01L 2224/2745* (2013.01); *H01L 2224/2782* (2013.01); *H01L 2224/27418* (2013.01); *H01L 2224/27444* (2013.01); *H01L 2224/27452* (2013.01); *H01L 2224/293* (2013.01); *H01L 2224/29005* (2013.01); *H01L 2224/2919* (2013.01); *H01L 2224/2929* (2013.01); *H01L 2224/29109* (2013.01); *H01L 2224/29111* (2013.01); *H01L 2224/29116* (2013.01); *H01L 2224/29124* (2013.01); *H01L 2224/29139* (2013.01); *H01L 2224/29144* (2013.01); *H01L 2224/29147* (2013.01); *H01L 2224/29205* (2013.01); *H01L 2224/29209* (2013.01); *H01L 2224/29211* (2013.01); *H01L 2224/29213* (2013.01); *H01L 2224/29299* (2013.01); *H01L 2224/29309* (2013.01); *H01L 2224/29311* (2013.01); *H01L 2224/29313* (2013.01); *H01L 2224/29316* (2013.01); *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/3201* (2013.01); *H01L 2224/32012* (2013.01); *H01L 2224/32501* (2013.01); *H01L 2224/32506* (2013.01); *H01L 2224/8385* (2013.01); *H01L 2224/83099* (2013.01); *H01L 2224/83193* (2013.01); *H01L 2224/83203* (2013.01); *H01L 2224/83805* (2013.01); *H01L 2924/01014* (2013.01); *H01L 2924/01322* (2013.01)

(58) Field of Classification Search
  CPC ...... B23K 1/0016; B23K 1/20; B23K 20/026; B23K 20/16; B23K 20/233; B23K 35/00; B23K 35/02; B23K 35/0238; B23K 35/0244; B23K 35/0272; B23K 35/26; B23K 35/262; B23K 35/268; B23K 35/282; B23K 35/3013; B23K 35/302; B23K 35/3033; B23K 35/3046; B23K 35/32; B23K 35/322; B23K 1/0018; B23K 2035/008; B23K 2201/40; B23K 2201/42; B23K 35/001; B23K 35/007
  See application file for complete search history.

(56) References Cited

FOREIGN PATENT DOCUMENTS

| WO | 2014/205193 A1 | 12/2014 |
| WO | 2017/019385 A1 | 2/2017 |

OTHER PUBLICATIONS

International Preliminary Report on Patentability dated Feb. 8, 2018 for International Application No. PCT/US2016/042966, entitled "Low-Temperature Bonding with Spaced Nanorods and Eutectic Alloys".

* cited by examiner

LOW-TEMPERATURE BONDING WITH SPACED NANORODS AND EUTECTIC ALLOYS

RELATED APPLICATION

This application is the U.S. National Stage of International Application No. PCT/US2016/042966, filed Jul. 19, 2016, which designates the U.S., published in English, and claims the benefit of U.S. Prov. App. No. 62/196,684, filed Jul. 24, 2015, the relevant teachings of which are incorporated herein by reference in their entirety.

GOVERNMENT SUPPORT

This invention was made with Government support under Grant numbers DE-SC0000894 and DE-SC0014035, both of which were awarded by the US Department of Energy. The Government has certain rights in the invention.

BACKGROUND OF THE INVENTION

Many systems and methods for bonding or sealing are application-specific. For example, and for the case of flexible electronics, organic solar cells and organic light emitting diodes, polymer adhesives, swage, or solder are typically employed. Polymer adhesives, however, generally cannot meet the need for oxygen and moisture impermeability of many applications and devices. Further, even if the initial permeability of the polymer is sufficient, over time the polymer will typically degrade and the leak rate will become too high. Also, the use of such low-temperature solder typically causes the heating of the organic semiconductor past its glass transition temperature and decreases its performance and lifetime. In other embodiments, integrated circuits often employ a thermal grease to make thermal contact between heat sinks, processors, and other components. However, such thermal greases often have poor conductivity and little strength. Soldering is employed in some applications, but often requires temperatures that are too high for the components.

Therefore a need exists for low-temperature welding that over comes or minimizes the above-referenced problems.

SUMMARY OF THE INVENTION

The invention is generally directed to a method for bonding surfaces that includes preparing the surfaces by forming nanorods on the surfaces and shells over the nanorods, wherein at least one of first and second nanorods, and first and second shells are formed of distinct metals.

In one embodiment, the method of the invention for bonding surfaces includes adhering first rods to a first surface, forming a first shell on the first nanorods, adhering second rods to a second surface, and forming a second shell on the second nanorods. At least one of the first and second nanorods, and the first and second shells, are formed of distinct metals. The surfaces are then exposed to at least one condition that causes the distinct metals to form an alloy. In one specific embodiment, the alloy is a eutectic alloy.

This invention has many advantages. For example, by employing either first and second nanorods of distinct metals, or first and second shells of distinct metals alloys can be formed upon exposure of the respective surfaces to at least one condition that causes the distinct metals to form an alloy that will have properties distinct from either of the metals alone. In one such embodiment, if the alloy is a eutectic metal alloy, and if the at least one condition is compression of the surfaces against each other, contact between the distinct metals will cause the formation of the eutectic metal alloy at a melting a point lower than that of the surfaces under compression, thereby causing a better seal between the surfaces. If the eutectic alloy thereafter forms an alloy with the metal of the first and second nanorods, the melting point of that alloy can, in one embodiment, be above that of the temperature of the surfaces under compression, thereby solidifying the seal between them. The same effect can occur if, instead, the first and second nanorods are formed of distinct metals that form an alloy, and the shells are of a third metal that, upon compression of the surfaces against each other will fracture, causing the distinct metals of the nanorods to form, for example, a eutectic alloy having a melting point lower than that of the surfaces under compression, and whereby continued compression causes an alloy to form that includes the metal of the ruptured shells, the melting point of that three-party alloy, then, can be above that of the surfaces under compression, thereby solidifying the seal between the surfaces. Further, regions of different chemical compositions in the bond naturally lead to a composite, which often has the advantage of combined mechanical strength and mechanical ductility.

DETAILED DESCRIPTION OF THE INVENTION

The invention generally is directed to a method for bonding surfaces that includes preparing the surfaces for bonding by forming nanorods on the surfaces and shells over the nanorods, wherein at least one of first and second nanorods, and first and second shells are formed of distinct metals.

Figure 1A:
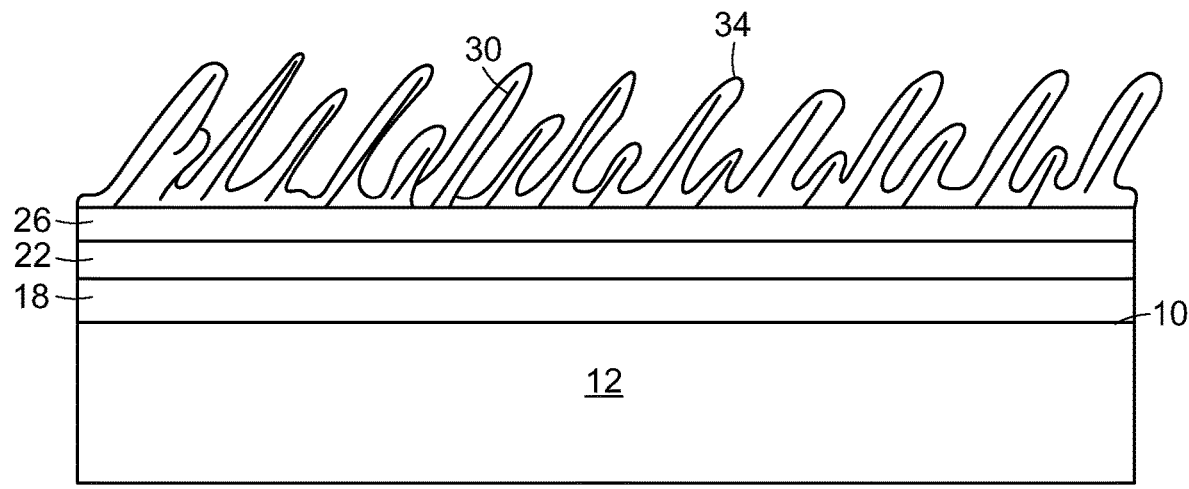
FIG. 1A is a cross-sectional view of one embodiment including a first surface of a first composite formed by a method of the invention.
Figure 1B:
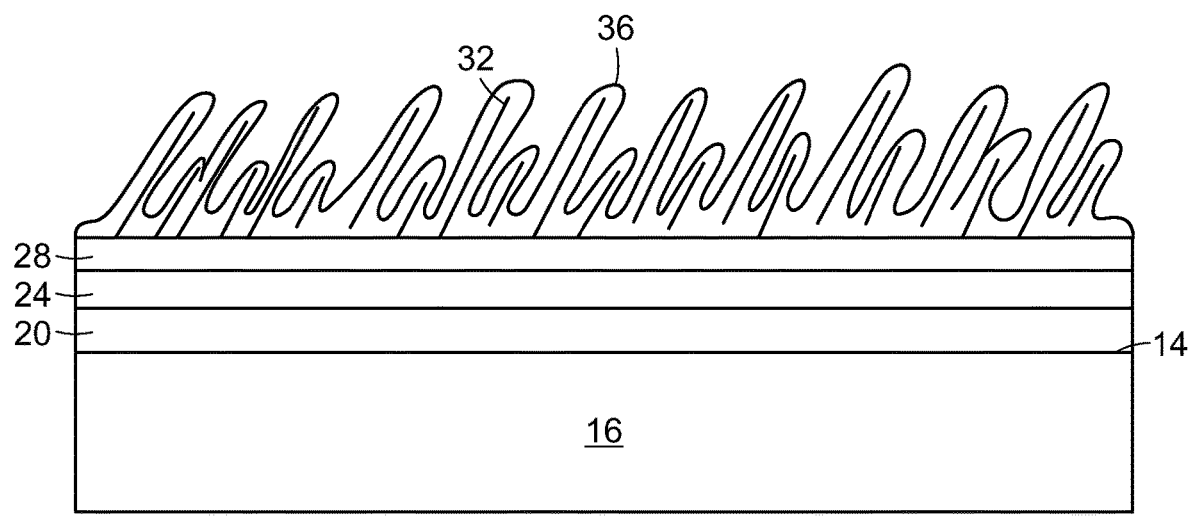
FIG. 1B is a cross-section of one embodiment including a second surface of a second composite, formed by a method of the invention and to be bonded to the first surface and the first composite.

Referring to FIGS. 1A and 1B, one embodiment of the method of the invention for bonding first surface 10 of first substrate 12 to second surface 14 of second substrate 16 includes depositing adhesion layers 18,20 over first surface 10 and second surface 14. Examples of suitable surfaces include silicon with and without native oxide, fused silica, borosilicate glass, silicon carbide (SiC), gallium nitride (GaN), copper, aluminum, steel, acrylic, polycarbonate, polyamide, and cyanates. Typically, adhesion layers 18,20 each have a thickness in a range of between about one atomic layer and about 50 nanometers (nm). Adhesion layers 18,20 are formed of a suitable material, such as is known to those skilled in the art. Examples of suitable materials of adhesion layers 18,20 include at least one member selected from the group consisting of chromium (Cr), titanium (Ti), nickel (Ni), tantalum (Ta), tantalum pentoxide ($Ta_2O_5$), titanium dioxide ($TiO_2$), tin (Sn), and molybdenum (Mo). Adhesion layers can be applied to first surface 10 and second surface 14 by a suitable method known to those of skill in the art. Examples of suitable methods of depositing adhesion layers 18,20 on first surface 10 and second surface 14 include physical vapor deposition such as sputtering, thermal or electron beam evaporation, electroplating, electroless plating, chemical vapor deposition, and solution synthesis. Preferably, adhesion layers 18,20 are deposited by sputtering, or electron beam deposition.

In one specific embodiment of the invention, barrier layers 22, 24 are deposited over adhesion layers 18,20. Barrier layers 22, 24 are formed of a material distinct from that of adhesion layers 18,20. Suitable materials of barrier layers 22, 24 are known to those of skill in the art and include, for example, tantalum (Ta), tungsten (W), gold (Au), nickel (Ni), chromium (Cr), iridium (Ir), palladium (Pd), titanium (Ti), aluminum (Al), titanium dioxide ($TiO_2$), aluminum oxide ($Al_2O_3$), and silicon oxide ($SiO/SiO_2$). In the case of an electrically insulating configuration, for example, a metal adhesion layer, such as tantalum (Ta), can be used in conjunction with an insulating barrier layer, such as $Al_2O_3$.

Typically, the thicknesses of barrier layers 22, 24 are in a range of between about one atomic layer and about 100 nm. In one specific embodiment, barrier layers 22, 24 are thicker than adhesion layers 18,20 over which they lay. In one specific embodiment, the aluminum of barrier layers 22, 24 is in the form of a metal oxide insulating barrier layer, such as aluminum oxide ($Al_2O_3$). Further, barrier layers 22, 24 are deposited by a suitable method known to those skilled in the art, such as physical vapor deposition electroplating, chemical vapor deposition, and solution synthesis.

In one embodiment, bond film layers 26, 28 are formed over adhesion layers of each of the first surface 10 and second surface 14. If barrier layers 22, 24 are present, bond film layers 26, 28 are formed over barrier layers 22, 24. Bond film layers 26, 28 are formed of a suitable material, such as is known to those skilled in the art. In a specific embodiment, bond film layers 26, 28 include at least one member selected from the group consisting of copper (Cu), silver (Ag), aluminum (Al), gold (Au), zinc (Zn), nickel (Ni), platinum (Pt) and palladium (Pd). Typically, the thickness of bond layers 26, 28 are in a range of between about 50 nanometers (nm) and about 10 micrometers (μm). Bond film layers 26, 28 are formed by a suitable method known to those skilled in the art, such as physical vapor deposition, electroplating, chemical vapor deposition, and solution synthesis. Preferably, bond film layers 26, 28 are formed of copper (Cu) by physical vapor deposition, and have a thickness in a range of between about 100 nm and about 1 μm.

First nanorods 30 and second nanorods 32 are deposited over respective bond film layers 26, 28. Optionally, in another embodiment, first nanorods 30 and second nanorods 32 can be formed on surfaces that include any combination of adhesion layers 18,20, barrier layers 22, 24, bond layers 26, 28, over additional layers, or directly on surfaces 10, 14.

First nanorods 30 and second nanorods 32 are formed by a suitable method, such as is known to those skilled in the art. In one embodiment, first nanorods 30 and second nanorods 32 are formed by a method described in Int'l. App. Publ. No.: WO 2014/205193 A1, and in United States Patent Publ. No.: US 2008/0003778 A1, the relevant teachings of both of which are incorporated herein by reference in their entirety. Typically, first nanorods 30 and second nanorods 32 stand on bond layers 26, 28 in spaced relation to each other. "Spaced relation," as that phrase is employed herein, means that a majority of the nanorods are not in contact with each other. In one embodiment, at least one of first nanorods 30 and second nanorods 32 are independently adhered to at least one of the surfaces 10, 14 by a suitable metalization method, such as is known to those skilled in the art. Examples of suitable methods of metalization include at least one member of the group consisting of coating, thermal spraying, vacuum deposition, vacuum metalization, vacuum coating, and physical vapor deposition. In a particular embodiment, both first nanorods 30 and second nanorods 32 are deposited over at least one of surfaces 10,14 by physical vapor deposition. In a specific embodiment, both first nanorods 30 and second nanorods 32 are each independently deposited over respective first surface 10 and second surface 14 by a suitable method, such as by physical vapor deposition (PVD).

Typically, first nanorods 30 and second nanorods 32 have thicknesses in a range of between about 10 nm and about 200 nm, and a length of between about 500 nm and about 2 μm. Preferably, first nanorods 30 and second nanorods 32 have thicknesses in a range of between about 50 nm and about 150 nm, and a length of between about 750 nm and about 1.25 μm. Also, the distance between first nanorods 30 over first surface 10, and between second nanorods 32 over second surface 14 is each, independently, typically in a range of between about 50 nm and about 500 nm, and, preferably between about 100 nm and about 300 nm.

In one embodiment, the metal of first nanorods 30 and second nanorods 32 are the same. In the embodiment where first nanorods 30 and second nanorods 32 are the same metal, the metal can be a suitable metal known to those of skill in the art of forming nanorods. Examples of suitable metals of first nanorods 30 and second nanorods 32 include at least one member selected from the group consisting of aluminum (Al), copper (Cu), silver (Ag), gold (Au), zinc (Zn), nickel (Ni), cadmium (Cd), and silicon (Si). Preferably, first nanorods 30 and second nanorods 32 are formed of copper (Cu).

Alternatively, first nanorods 30 and second nanorods 32 can be formed of distinct metals, such as metals that, in combination, form a eutectic alloy, which can be an alloy of chemical compositions that leads to a low melting temperature, but not necessarily the lowest melting temperature. Examples of suitable metals that, in combination, will form a eutectic alloy include: indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium, and bismuth (InBi); indium, bismuth, and cadmium (InBiCd); bismuth, lead and tin (BiPbSn); and bismuth, lead and cadmium (BiPbCd). In one specific embodiment, at least one of the metals of first nanorods 30 and second nanorods 32 is deposited over respective surfaces as an alloy.

Examples of suitable combinations of distinct metals of the first nanorods and second nanorods include at least two members of the group consisting of indium (In), gallium (Ga), tin (Sn), bismuth (Bi), zinc (Zn), cadmium (Cd) and lead (Pb).

First shells 34 and second shells 36 are formed on first nanorods 30 and second nanorods 32, respectively. At least one of the first nanorods 30 and second nanorods 32, and first shells 34 and second shells 36 are formed of distinct materials. In one embodiment, first nanorods 30 and second nanorods 32 are formed of a common metal. In this embodiment, first shells 34 and second shells 36 are formed of distinct metals. In a specific embodiment, the distinct metals of first shells 34 and second shells 36, when combined, form a eutectic alloy. Examples of metals that, in combination, will form a eutectic alloy includes at least two members of the group consisting of indium (In), gallium (Ga), tin (Sn), bismuth (Bi), zinc (Zn), cadmium (Cd) and lead (Pb). In another embodiment, at least one of first shells 34 and second shells 36 is an alloy. In a particular embodiment, the alloy includes at least two members of the group consisting of indium (In), gallium (Ga), tin (Sn), bismuth (Bi), zinc (Zn), cadmium (Cd) and lead (Pb). Examples of particular combinations of metals of first shells 34 and second shells 36 that, in combination, form a eutectic alloy include: indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium and bismuth (InBi); indium, bismuth, and cadmium (InBiCd); bismuth, lead and tin (BiPbSn); and bismuth, lead and cadmium (BiPbCd). In this embodiment, the metal of first nanorods 30 and second nanorods 32 each independently consists of at least one member of the group consisting of aluminum (Al), copper (Cu), silver (Ag), gold (Au), platinum (Pt), zinc (Zn), nickel (Ni), cadmium (Cd), silicon (Si), indium (In), gallium (Ga), tin (Sn), bismuth (Bi), and lead (Pb). In a specific embodiment, the metal of first nanorods 30 and second nanorods 32 consists of a common metal that is at least one member of the group consisting of aluminum, copper (Cu), silver (Ag), gold (Au), zinc (Zn), nickel (Ni), cadmium (Cd), silicon (Si), indium (In), gallium (Ga), tin (Sn), bismuth (Bi), and lead (Pb). In a specific embodiment, the combination of the metals of first shells 34 and second shells 36 is a eutectic alloy, and an alloy of the metals of first shells 34 and second shells 36 with the common metal of the nanorods 30, 32 is an alloy that has a melting point above that of the metal of either of first shells 34 or second shells 36.

In another embodiment, first nanorods 30 and second nanorods 32 are distinct metals that, optionally, in combination form a eutectic alloy, and first shells 34 and second shells 36 are of a common material that is at least one member selected from the group consisting of a metal, a metal alloy, a metal oxide, and a polymer. In one embodiment, the common material is a polymer that includes at least one member selected from the group consisting of dodecyclamine, alkylamine, sodium polyacrylate, and silver (Ag) citrate complexes. In a specific embodiment, the polymer is a combination of miscible polymers that bonds by intermolecular force between aromatic rings. Examples of suitable miscible polymers include: poly(methyl methacrylate) (PMMA) with polyvinyl fluoride (PVDF); polyethylene terephthalate (PET) with polybutylene terephthalate (PBT); and polyphenylene oxide (PPO) with polystyrene (PS). In some specific instances, miscibility of polymer shells is promoted by addition of a layer of a suitable compatibalizer, such as copolymers, and block copolymers. In another embodiment, the common material of first shells 34 and second shells 36 is at least one metal or metal alloy. Examples of suitable metals common to first shells 34 and second shells 36 when first nanorods 30 and second nanorods 32 are formed of distinct metals, include tin (Sn), indium (In), silver (Ag), and gold (Au). Examples of suitable common metal alloys of first shells 34 and second shells 36, wherein first nanorods 30 and second nanorods 32 are formed of distinct metals include an alloy of: indium and gallium (InGa); indium and bismuth (InBi); and tin and indium (SnIn).

In another embodiment, the at least one metal or metal alloy that is common to first shells 34 and second shells 36 is magnetic, whereby exposure of first shells 34 and second shells 36 to a magnetic field ruptures first shells 34 and second shells 36. Examples of suitable magnetic metals and metal alloys include iron, nickel, cobalt, ferrite, alnico, NdFeB, SmCo, Terfenol-D ($Tb_{0.3}Dy_{0.7}Fe_{1.92}$).

Figure 2:
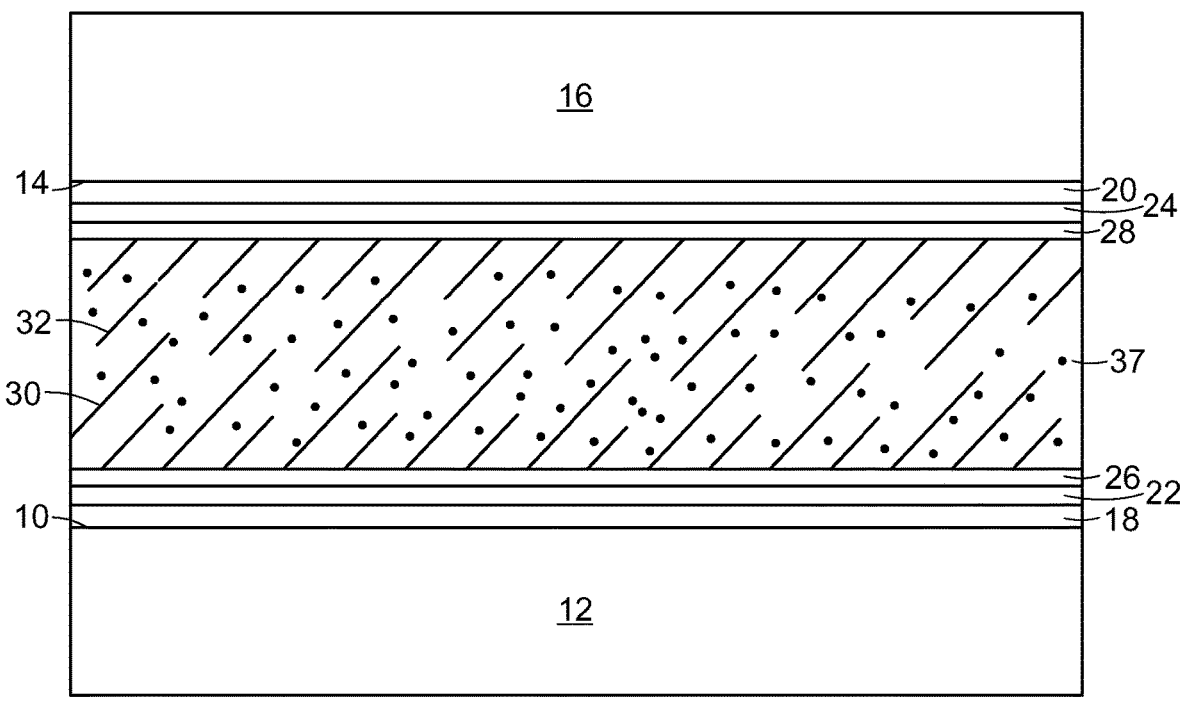
FIG. 2 is a cross-section of a composite formed by combining the composites of FIGS. 1A and 1B, wherein the shell components of the composites of FIGS. 1A and 1B combine and bond the surfaces of the respective composites.

In one embodiment, the at least one condition that causes the distinct metals to form an alloy is at least one member selected from the group consisting of atomic diffusion, chemical reaction, heat, and pressure. For example, chemical reactions with metal alloys can include formation of metallic bonds, such as exothermic reactions of shell materials resulting in heating without the addition of an external heat source. In a specific embodiment, wherein first nanorods 30 and second nanorods 32 are formed of a common metal, and first shells 34 and second shells 36 are formed of distinct metals, the conditions include applying pressure between a first surface 10 and second surface 14 in an amount sufficient to cause contact between first shells 34 and second shells 36 and to cause the distinct metals of first shells 34 and second shells 36 to form alloy 37, as can be seen in FIG. 2.

In one embodiment, alloy 37 is a eutectic alloy. In a specific embodiment, the melting point of the eutectic alloy is lower than that of the ambient temperature to which the first and second circuit surfaces are exposed prior to compression between them. In one specific embodiment, the melting point of the eutectic alloy is lower than that of the temperature at which the eutectic alloy is formed during compression of the first surface and second surface.

Figure 3:
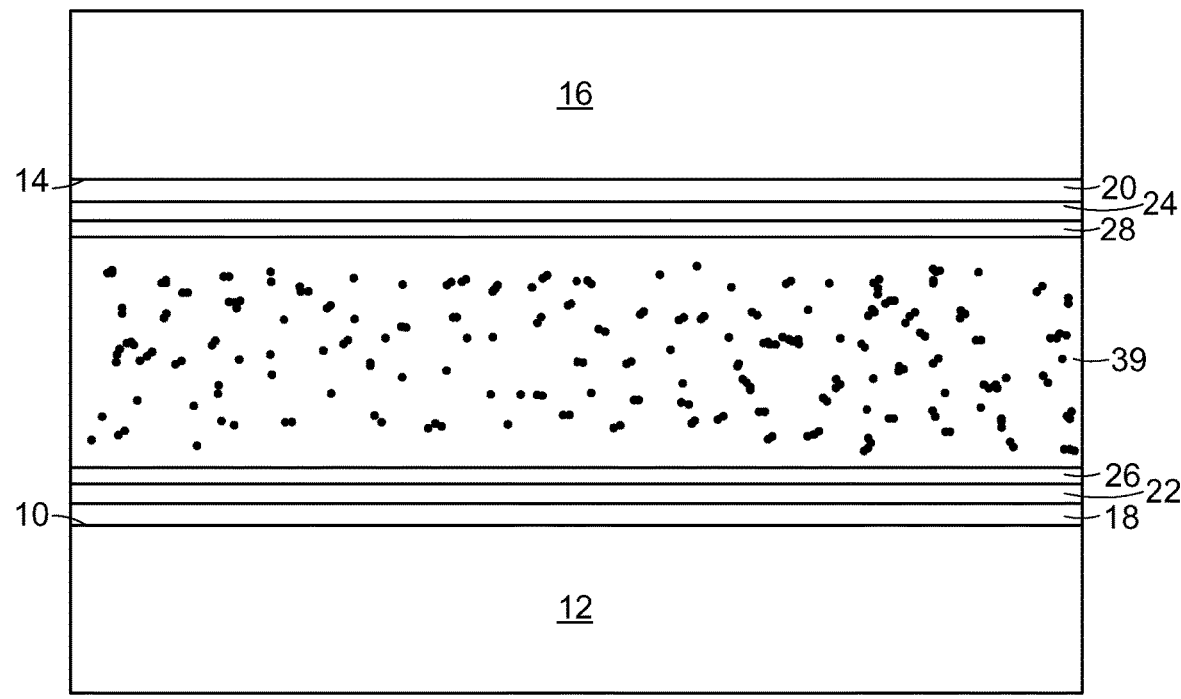
FIG. 3 is a cross-section of a composite formed by combining the composites of FIGS. 1A and 1B, thereby causing combination of the shells and nanorods of the composites of FIGS. 1A and 1B, and bonding the surfaces of the respective composites.

In still another embodiment, upon continued application of pressure and heat, the common metal of first nanorods 30 and second nanorods 32 forms alloy 39 with eutectic alloy 37 formed from first shells 34 and second shells 36, as shown in FIG. 3. In a specific embodiment, the melting point of alloy 39 of first nanorods 30 and second nanorods 32 with eutectic alloy 37 formed from first shells 34 and second shells 36 is higher than that of the temperature under which the eutectic alloy is formed from the first shells 34 and second shells 36. In this embodiment, the liquid of eutectic alloy 37, upon forming an alloy 39 with first nanorods 30 and second nanorods 32 forms a solid, which completes fabrication of a bond between first surface 10 and second surface 14.

Alternatively, in another embodiment, first nanorods 30 and second nanorods 32 are formed of distinct metals, and first shells 34 and second shells 36 are formed of a common material, such as at least one member selected from the group consisting of a metal, a metal alloy, a metal oxide, and a polymer. In this embodiment, application of compression between first surface 10 and second surface 14 causes first shells 34 and second shells 36 to rupture, thereby exposing the distinct metals of first nanorods 30 and second nanorods 32, whereby an alloy is formed of the distinct metals of first nanorods 30 and second nanorods 32, such as the formation of a eutectic alloy, having a melting point as described in any of the embodiments set forth above.

In still another embodiment, wherein the common metal of first shells 34 and the second shells 36 is magnetic, the condition under which the distinct metals of the first nanorods 30 and the second nanorods 32 form alloy 37, such as a eutectic alloy, is contact between first shells 34 and second shells 36, followed by exposure of first shells 34 and second shells 36 to a magnetic field that causes first shells 34 and second shells 36 to rupture, whereby the distinct metals of first nanorods 30 and second nanorods 32 are placed in contact with each other and form an alloy, such as a eutectic alloy. Optionally, subsequent application of a suitable condition, such as pressure or heat, can cause the eutectic alloy to form alloy 39 with the metal of first shells 34 and second shells 36, the alloy having a melting point above that of the temperature at which first shells 34 and second shells 36 are ruptured and formation of the eutectic alloy.

While this invention has been particularly shown and described with references to example embodiments thereof, it will be understood by those skilled in the art that various changes in form and details may be made therein without departing from the scope of the invention encompassed by the appended claims.

EXEMPLIFICATION

A first surface and second surface of silicon native oxide were formed on a first substrate and a second substrate, respectively, of silicon. These surfaces were coated with chromium (Cr) to a depth of 10 nm by physical vapor deposition to form an adhesion layer, and copper (Cu) to a depth of 500 nm to form a bond film layer. Next, nanorods of 500 nm were produced by PVD on both bond film layers. The first shell was deposited by physical vapor deposition (PVD) of 100 nm of indium (In), and the second shell to 200 nm of gallium (Ga). The first and second substrates were pressed together at 100 C at 10 MPa for 30 min to form the bond.

Figure 4:
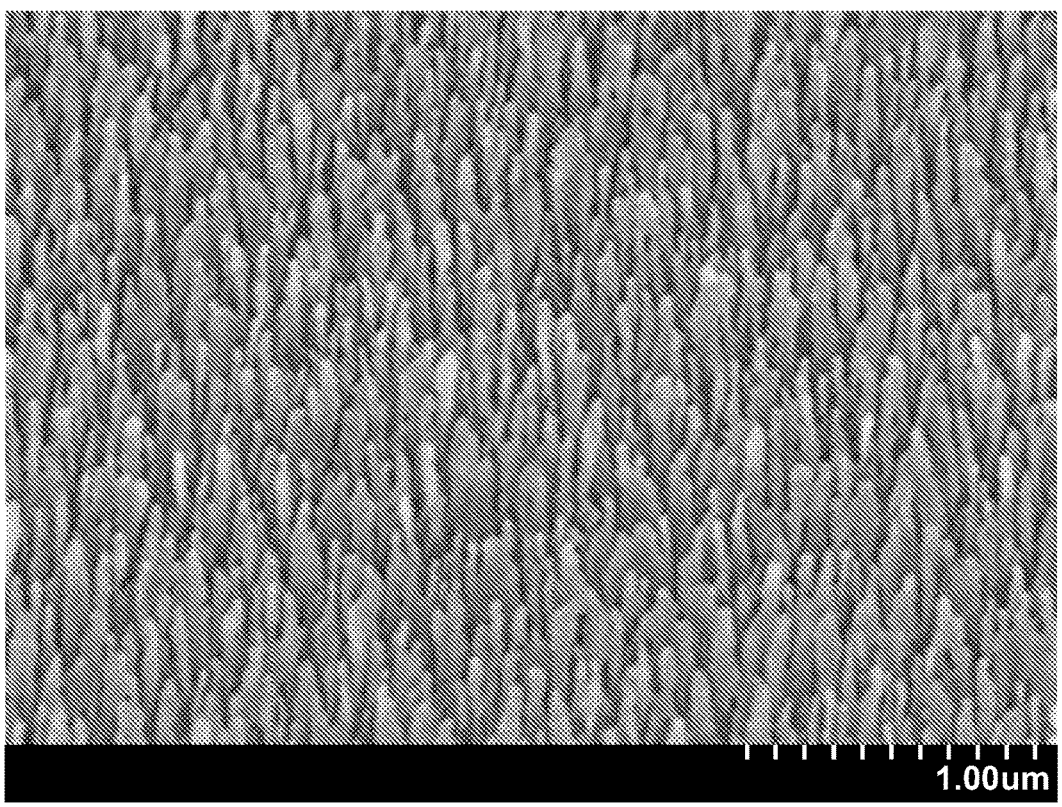
FIG. 4 is a photograph of copper (Cu) nanorods formed with an indium shell.
Figure 5:
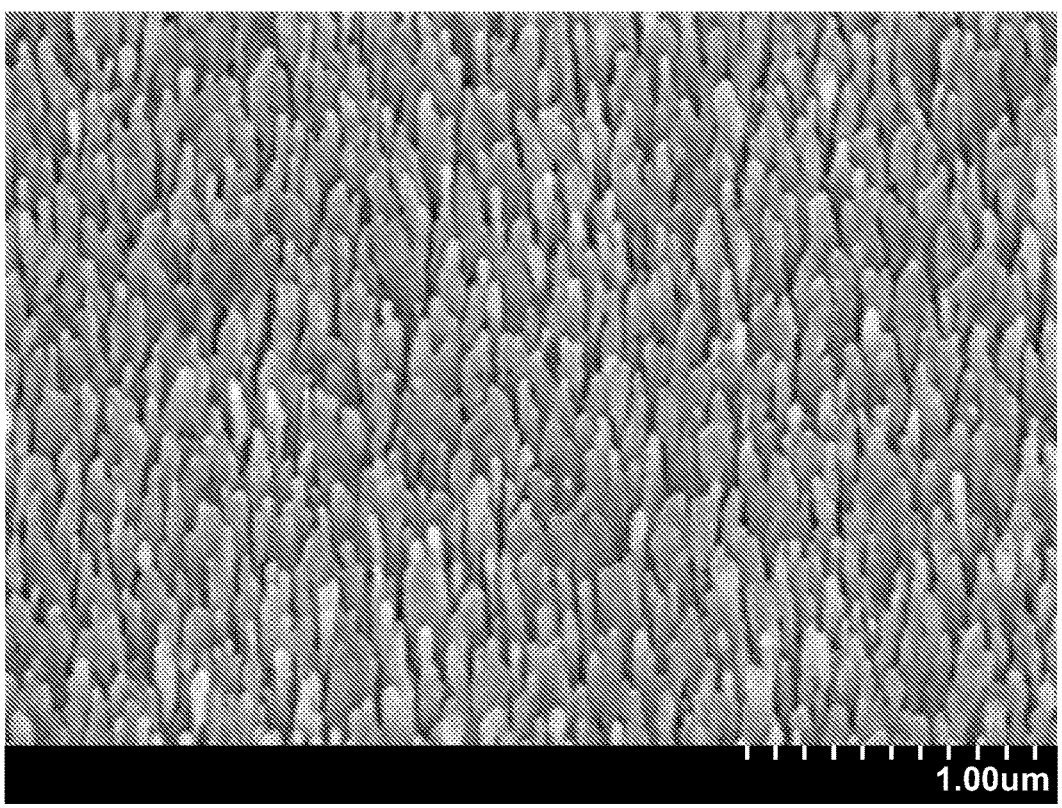
FIG. 5 is a photograph of copper (Cu) nanorods with a gallium (Ga) shell formed by a method of the invention.
Figure 6:
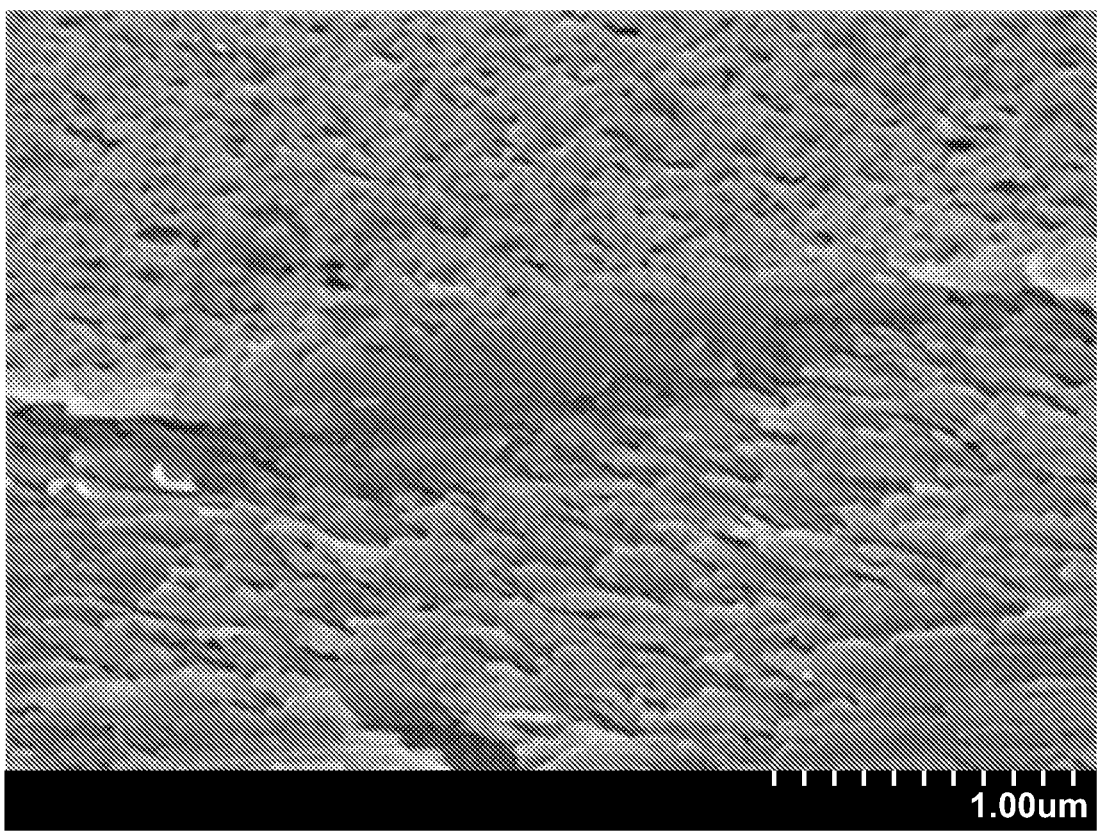
FIG. 6 is an SEM image of the joined nanorods formed by the method of the invention, at a side view 75 degrees from substrate normal.

FIG. 3 is a cross-section of a composite formed by combining the composites of FIGS. 1A and 1B, thereby causing combination of the shells and nanorods of the composites of FIGS. 1A and 1B, and bonding the surfaces of the respective composites. FIG. 4 is a photograph of copper (Cu) nanorods formed with an indium shell. FIG. 5 is a photograph of copper (Cu) nanorods with a gallium (Ga) shell formed by a method of the invention. FIG. 6 is an SEM image of the joined nanorods formed by the method of the invention, at a side view 75 degrees from substrate normal. The indium coated rods can be seen in the bottom half of the image. The top half shows the bottom side of the gallium coated rods that have detached from the surface.

The relevant teachings of all patents, published applications and references cited herein are incorporated by reference in their entirety.

What is claimed is:

1. A method for bonding surfaces, the method comprising the steps of:
    a) adhering first nanorods to a first surface;
    b) forming a first shell on the first nanorods;
    c) adhering second nanorods to a second surface;
    d) forming a second shell on the second nanorods, wherein the first and second nanorods are formed of distinct metals, wherein the first shell and second shell are formed of a common material, and wherein the common material is a magnetic metal or magnetic metal alloy; and
    e) exposing the surfaces to a magnetic field that ruptures the first and second shells and causes the distinct metals to form a eutectic alloy.

2. The method of claim 1, wherein the eutectic alloy includes at least two members of the group consisting of indium, gallium, tin, bismuth, zinc, cadmium and lead.

3. The method of claim 1, wherein the eutectic alloy is selected from the group consisting of indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium, and bismuth (InBi); indium, bismuth, and cadmium (InBiCd); bismuth, lead and tin (BiPbSn); and bismuth, lead and cadmium (BiPbCd).

4. The method of claim 1, wherein the common material is a magnetic metal.

5. The method of claim 1, further including the step of forming an alloy of the common material of the first and second shells with the distinct metals of the first and second nanorods, wherein the melting point of the alloy of the common material of the first and second shells and the distinct metals of the nanorods is greater than that of the eutectic alloy.

6. The method of claim 1, wherein each of the distinct metals is selected from the group consisting of aluminum (Al), copper (Cu), silver (Ag), gold (Au), platinum (Pt), zinc (Zn), nickel (Ni), silicon (Si), indium (In), gallium (Ga), tin (Sn), bismuth (Bi), lead (Pb), and cadmium (Cd).

7. The method of claim 1, wherein the eutectic alloy is selected from the group consisting of indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium, and bismuth (InBi); indium, bismuth, and cadmium (InBiCd); bismuth, lead and tin (BiPbSn); and bismuth, lead and cadmium (BiPbCd).

8. The method of claim 1, wherein the common material is selected from the group consisting of aluminum (Al), copper (Cu), silver (Ag), gold (Au), zinc (Zn), nickel (Ni), cadmium (Cd) and silicon (Si).

9. The method of claim 1, wherein adhering first nanorods to the first surface and adhering second nanorods to the second surface further comprises the steps of:
    a) forming an adhesion layer over each of the first and second surfaces;
    b) forming a bond film layer over the adhesion layer of each of the first and second surfaces; and
    c) forming the first nanorods over the bond film layer of the first surface and forming the second nanorods over the bond film layer of the second surface.

10. The method of claim 9, further including the step of depositing a barrier layer over each adhesion layer before depositing the bond film layer.

11. The method of claim 10, wherein the adhesion layer has a thickness from about one atomic layer and to about 100 nm.

12. The method of claim 11, wherein the barrier layer is thicker than the adhesion layer.

13. The method of claim 12, wherein the barrier layer includes at least one member of the group consisting of tantalum (Ta), tungsten (W), gold (Au), nickel (Ni), chromium (Cr), iridium (Ir), palladium (Pd), titanium (Ti), and aluminum (Al).

14. The method of claim 13, wherein the aluminum (Al) is in the form of aluminum oxide ($Al_2O_3$).

15. The method of claim 14, wherein the adhesion layer includes at least one member from the group consisting of chromium (Cr), titanium (Ti), nickel (Ni), tantalum (Ta), tantalum pentoxide ($Ta_2O_5$), titanium dioxide ($TiO_2$), tin (Sn), and molybdenum (Mo).

16. The method of claim 9, wherein the bond film layer includes copper (Cu), silver (Ag), aluminum (Al), gold (Au), zinc (Zn), nickel (Ni), platinum (Pt) and palladium (Pd).

17. The method of claim 9, wherein the first nanorods and the second nanorods are each independently adhered to the first and second surfaces by metalization.

18. The method of claim 17, wherein the metalization includes at least one member selected from the group consisting of coating, thermal spraying, vacuum deposition, vacuum metalization, vacuum coating, and physical vapor deposition.

19. The method of claim 18, wherein each of the first nanorods and the second nanorods are independently adhered to the surfaces by physical vapor deposition.

20. The method of claim 19, wherein both the first nanorods and the second nanorods are each independently adhered to the respective first and second surfaces by physical vapor deposition.

21. A method for bonding surfaces, said method comprising the steps of:
    a) adhering first nanorods to a first surface;
    b) forming a first shell on the first nanorods;
    c) adhering second nanorods to a second surface;
    d) forming a second shell on the second nanorods, wherein the first and second nanorods are formed of distinct metals, wherein the first shell and second shell are formed of a common material, and wherein the common material is a polymer; and
    e) exposing the surfaces to at least one condition that causes the distinct metals to form a eutectic alloy.

22. The method of claim 21, wherein the polymer includes at least one member selected from the group consisting of polycaprolactone, ethylene vinyl acetate, polyolefins, polyamides, polyesters, polyurethanes, and styrene block copolymers.

23. The method of claim 22, wherein the polymer is a combination of miscible polymers.

24. The method of claim 23, wherein the combination of miscible polymers bond by intermolecular force between aromatic rings.

25. The method of claim 23, wherein the combination of miscible polymers is selected from the group consisting of: poly(methyl methacrylate) (PMMA) with polyvinylidene fluoride (PVDF), polyethylene terephthalate (PET) with polybutylene terephthalate (PBT); and polyphenylene oxide (PPO) with polystyrene (PS).

26. The method of claim 21, wherein the eutectic alloy includes at least two members of the group consisting of indium, gallium, tin, bismuth, zinc, cadmium and lead.

27. The method of claim 21, wherein the eutectic alloy is selected from the group consisting of indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium, and bismuth (InBi); indium, bismuth, and cadmium (InBiCd); bismuth, lead and tin (BiPbSn); and bismuth, lead and cadmium (BiPbCd).

28. The method of claim 21, wherein each of the distinct metals is selected from the group consisting of aluminum (Al), copper (Cu), silver (Ag), gold (Au), platinum (Pt), zinc (Zn), nickel (Ni), silicon (Si), indium (In), gallium (Ga), tin (Sn), bismuth (Bi), lead (Pb), and cadmium (Cd).

29. The method of claim 21, wherein the eutectic alloy is selected from the group consisting of indium and gallium (InGa); indium, gallium, and tin (InGaSn); indium, gallium, and bismuth (InGaBi); indium, gallium, tin and bismuth (InGaSnBi); indium, gallium, tin and zinc (InGaSnZn); indium, gallium, tin, and cadmium (InGaZnCd); indium, gallium and lead (InGaPb); indium, gallium, lead and tin (InGaPbSn); indium, gallium, lead, and zinc (InGaPbZn); indium, and bismuth (InBi); indium, bismuth, and cadmium (InBiCd); bismuth, lead and tin (BiPbSn); and bismuth, lead and cadmium (BiPbCd).

30. The method of claim 21, wherein adhering first nanorods to the first surface and adhering second nanorods to the second surface further comprises the steps of:
    a) forming an adhesion layer over each of the first and second surfaces;
    b) forming a bond film layer over the adhesion layer of each of the first and second surfaces; and
    c) forming the first nanorods over the bond film layer of the first surface and forming the second nanorods over the bond film layer of the second surface.

31. The method of claim 30, further including the step of depositing a barrier layer over each adhesion layer before depositing the bond film layer.

32. The method of claim 31, wherein the adhesion layer has a thickness from about one atomic layer and to about 100 nm.

33. The method of claim 32, wherein the barrier layer is thicker than the adhesion layer.

34. The method of claim 32, wherein the barrier layer includes at least one member of the group consisting of tantalum (Ta), tungsten (W), gold (Au), nickel (Ni), chromium (Cr), iridium (Ir), palladium (Pd), titanium (Ti), and aluminum (Al).

35. The method of claim 9, wherein the bond film layer includes copper (Cu), silver (Ag), aluminum (Al), gold (Au), zinc (Zn), nickel (Ni), platinum (Pt) and palladium (Pd).

36. The method of claim 9, wherein the first nanorods and the second nanorods are each independently adhered to the first and second surfaces by metalization.

37. The method of claim 17, wherein the metalization includes at least one member selected from the group consisting of coating, thermal spraying, vacuum deposition, vacuum metalization, vacuum coating, and physical vapor deposition.

38. The method of claim 18, wherein each of the first nanorods and the second nanorods are independently adhered to the surfaces by physical vapor deposition.

39. The method of claim 19, wherein both the first nanorods and the second nanorods are each independently adhered to the respective first and second surfaces by physical vapor deposition.

* * * * *

UNITED STATES PATENT AND TRADEMARK OFFICE
CERTIFICATE OF CORRECTION

PATENT NO.         : 10,646,964 B2
APPLICATION NO.    : 15/746536
DATED              : May 12, 2020
INVENTOR(S)        : Stephen Peter Stagon, Hanchen Huang and Paul Robert Elliott It is certified that error appears in the above-identified patent and that said Letters Patent is hereby corrected as shown below:

In Claim 19, Column 9, at Line 24, delete "wherein each of the first" and replace with --wherein each of at least one of the first--

In Claim 19, Column 9, at Line 26, delete "adhered to the surfaces" and replace with --adhered to at least one of the surfaces--

In Claim 38, Column 10, at Line 58, delete "wherein each of the first" and replace with --wherein each of at least one of the first--

In Claim 38, Column 10, at Line 60, delete "adhered to the surfaces" and replace with --adhered to at least one of the surfaces--

Signed and Sealed this
Seventh Day of July, 2020

Andrei Iancu
*Director of the United States Patent and Trademark Office*